(12) United States Patent
Sorimachi

(10) Patent No.: US 6,951,811 B2
(45) Date of Patent: Oct. 4, 2005

(54) METHOD OF PRODUCING VIAS AND OTHER CONDUCTOR PARTS ON AN ELECTRODE TERMINAL FORMING SURFACE OF A SEMICONDUCTOR WAFER

(75) Inventor: Haruo Sorimachi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/828,328

(22) Filed: Apr. 21, 2004

(65) Prior Publication Data
US 2004/0229446 A1 Nov. 18, 2004

(30) Foreign Application Priority Data
May 12, 2003 (JP) ........................................ 2003-132652

(51) Int. Cl.⁷ .......................................... H01L 21/4763
(52) U.S. Cl. ........................ 438/637; 438/678; 438/674; 438/459
(58) Field of Search ................................. 438/622, 637, 438/460, 459, 675, 674, 678

(56) References Cited
U.S. PATENT DOCUMENTS
2002/0081530 A1 * 6/2002 Yamamoto et al. ......... 430/313
2002/0192867 A1 * 12/2002 Nishiyama .................. 438/110

FOREIGN PATENT DOCUMENTS
JP   2002-93942    3/2002
JP   2002-134651   5/2002
JP   2002-270720   9/2002

* cited by examiner

Primary Examiner—Brad Smith
(74) Attorney, Agent, or Firm—Staas & Halsey LLP

(57) ABSTRACT

A method of production of a semiconductor device able to utilize a conventional production system for a resin board to thereby produce a wafer level package without increasing the production cost, comprising electrolessly plating the electrode terminals to cover the surfaces of the electrode terminals by a protective film protecting the electrode terminals from laser beams; grinding the back side of the semiconductor wafer to reduce the thickness of the semiconductor wafer before or after forming the protective film; covering the entirety of the electrode terminal forming surface and back side of the semiconductor wafer, having the electrode terminals covered by a protective film and processed to reduce the thickness of the semiconductor wafer, by a resin to form a laminate; and focusing a laser beam toward the electrode terminal forming surface of the semiconductor wafer from outside the laminate to form via holes with the protective film exposed at their bottom surfaces, then filling the via holes by electroplating to form the conductor parts.

4 Claims, 4 Drawing Sheets

METHOD OF PRODUCING VIAS AND OTHER CONDUCTOR PARTS ON AN ELECTRODE TERMINAL FORMING SURFACE OF A SEMICONDUCTOR WAFER

BACKGROUND OF THE INVENTION

1. Field of the Invention

The present invention relates to a method of production of a semiconductor device, more particularly relates to a method of production of a wafer level package.

2. Description of the Related Art

As a method of production of a semiconductor device, there is the method of forming insulating layers, interconnect patterns, external electrode terminals, etc. on the surface of a semiconductor wafer at the stage of the semiconductor wafer where semiconductor chips are formed arranged in predetermined defined arrangements, and finally dicing the semiconductor wafer into individual pieces so as to produce chip-sized semiconductor devices (wafer level package). Japanese Unexamined Patent Publication (Kokai) No. 2002-93942 describes a method of production of a semiconductor device comprising forming a reinterconnect layer at the surface of the semiconductor wafer where the electrode terminals are formed, forming a reinterconnect layer on the back side of a semiconductor chip from the semiconductor chip side, and forming external terminals electrically connected with the electrode terminals.

Japanese Unexamined Patent Publication (Kokai) No. 2002-134651 describes a method of production of a semiconductor device comprising forming connection bumps on electrode terminals of a semiconductor wafer, then covering the surface on which the connection bumps are formed by a resin so that the end faces of the connection bumps are exposed and further covering the back side of the semiconductor wafer by a resin. Further, Japanese Unexamined Patent Publication (Kokai) No. 2002-270720 describes a method of production of a semiconductor device comprising forming projecting electrodes on electrode pads of the surfaces of the semiconductor chips of the semiconductor wafer, covering the surface of the semiconductor wafer by an insulating resin so that the projecting electrodes are exposed, grinding the back side of the semiconductor wafer, then covering the back side of the semiconductor wafer by an insulating resin, and dicing the semiconductor wafer to obtain the individual semiconductor devices.

In the above conventional methods of production of wafer level packages, sputtering etc. are used to form a film on or expose the semiconductor wafer to produce a semiconductor device. Therefore, production of such a product required use of expensive production systems such as film-forming systems or exposure systems. In particular, when using a 300 mm (12 inch) large-sized semiconductor wafer, for which it is considered use will increase, to produce a semiconductor package, it is necessary to construct a new production system, but there is the problem that new investment is necessary.

A wafer level package has a thermal expansion coefficient substantially equal to the thermal expansion coefficient of the silicon material of a semiconductor wafer, so when mounting a wafer level package on a resin board (mounting circuit board) made of a resin usually used for a mounting circuit board, the thermal expansion coefficient greatly differs from the resin board, so there is the problem that heat stress acts on the connecting parts of the wafer level package and resin board (solder balls) and the connecting parts crack. Accordingly, the products previously provided as wafer level packages were limited to small products of a size of not more than 10 mm square or so. Further, in conventional wafer level packages, sometimes the silicon material of the semiconductor wafer was left exposed to the outside in the product. With such a product, the package is insufficiently protected. Further, the back side is not electrically insulated, so electrical short-circuits occur at the back side of the package.

SUMMARY OF THE INVENTION

An object of the present invention is to provide a method of production of a semiconductor device which can be produced without using expensive semiconductor device production systems, can be matched in thermal expansion coefficient with the mounting circuit board, and can be easily mounted.

To attain the above object, there is provided a method of production of a semiconductor device comprising forming vias and other conductor parts on an electrode terminal forming surface of a semiconductor wafer, that are electrically connected with electrode terminals, and dicing the semiconductor wafer into individual semiconductor chips to form chip-sized semiconductor devices, comprising the steps of electrolessly plating the electrode terminals to cover the surfaces of the electrode terminals by a protective film protecting the electrode terminals from laser beams; grinding the back side of the semiconductor wafer to reduce the thickness of the semiconductor wafer before or after forming the protective film; covering the entirety of the electrode terminal forming surface and back side of the semiconductor wafer, having the electrode terminals covered by a protective film and processed to reduce the thickness of the semiconductor wafer, by a resin to form a laminate; and focusing a laser beam toward the electrode terminal forming surface of the semiconductor wafer from outside the laminate to form via holes with the protective film exposed at their bottom surfaces, then filling the via holes by electroplating to form the conductor parts.

Preferably, the method of production further comprises the steps of bonding external connection terminals at lands of the conductor parts after forming the conductor parts and dicing the semiconductor wafer into individual semiconductor chips after bonding the external connection terminals to the lands.

Alternatively, the method of production further comprises, when covering the entirety of the electrode terminal forming surface and back side of the semiconductor wafer by a resin, using a resin having a thermal expansion coefficient close to the thermal expansion coefficient of a resin board. Alternatively, the method of production of a semiconductor device further comprises forming interconnect patterns electrically connected with the conductor parts through the electrical insulating layer after forming the conductor parts.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Figure 1A:
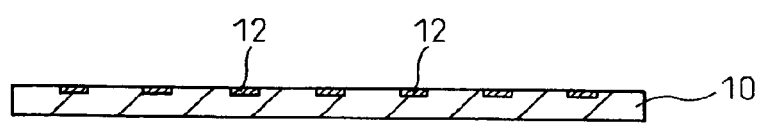
FIGS. 1A to 1J is a cross-sectional view of a method of production of a semiconductor device according to the present invention.

Preferred embodiments of the present invention will be described in detail below while referring to the attached figures. FIGS. 1A to 1J and FIG. 2 are cross-sectional views of method of production of a semiconductor device according to a first embodiment of the present invention. FIG. 1A shows a semiconductor wafer 10 having semiconductor chips formed arranged at predetermined defined arrangements. Reference numeral 12 shows electrode terminals (aluminum pads) formed on the electrode forming surface of the semiconductor wafer 10. Note that at an actual semiconductor wafer, a large number of electrode terminals 12 are formed, but in this figure, the electrode terminals 12 are shown for explanatory purposes.

Figure 1B:
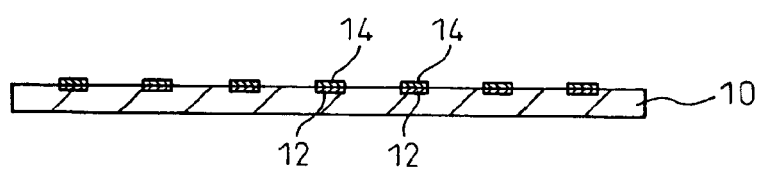

FIG. 1B shows the state of covering the surfaces of the electrode terminals 12 by a protective film 14 so that the electrode terminals 12 are not damaged by the laser beam used when forming via holes in the insulating layer by laser processing at a later step. The protective film 14 is comprised of a material having conductivity for electrically connecting with the electrode terminals 12. The material is not particularly in question so long as it can protect the electrode terminals 12 from a laser beam. In the present embodiment, the semiconductor wafer 10 is electrolessly plated with nickel to form a nickel layer on the surfaces of the electrode terminals 12 as a protective film 14. By applying the treatment for selectively depositing electroless plating on the surfaces of the electrode terminals 12 to the semiconductor wafer 10 in advance, it is possible to form a protective film 14 simply on only the surfaces of the electrode terminals 12 by electroless plating. The protective film 14 should be formed to a thickness of about 10 to 20 μm.

Note that it is also possible to form a protective film 14 on the surfaces of the electrode terminals 12, then gold plate, copper plate, etc. the surface of the protective film 14 to lower the contact resistance with the interconnect patterns electrically connecting with the electrode terminals 12. The method of using electroless plating to form a protective film 14 or a gold plating film or copper plating film as in the present embodiment has the advantages that it does not require use of any special mask for forming the laser protective film, the processing work is easier compared with sputtering or another thin film processing step, and expensive systems compared with electroless plating systems such as thin film processing systems are not required.

Figure 1C:
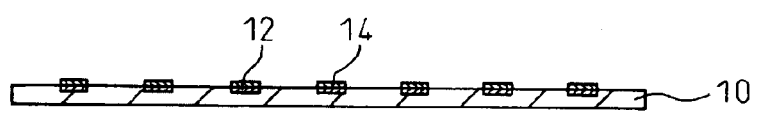

FIG. 1C shows the state of grinding the side of the semiconductor wafer 10 opposite to the side of forming the electrode terminals 12 (back side of semiconductor wafer) to reduce the thickness of the semiconductor wafer 10. By making the semiconductor wafer 10 thinner, the thickness of the semiconductor device as a whole becomes smaller and the semiconductor device can be formed compact. It is easy to use grinding to reduce a semiconductor wafer of a thickness of about 600 μm down to a thickness of about 100 to 200 μm. Note that the step of covering the surfaces of the electrode terminals 12 by a protective film 14 may also be performed after the processing for grinding the back side of the semiconductor wafer 10. That is, it is also possible to grind the back side of the semiconductor wafer 10, then perform treatment for selectively depositing an electroless plating on the surfaces of the electrode terminals 12 for electroless plating the surface so as to form a protective film 14 on the surface of the terminal electrodes 12.

Figure 1D:
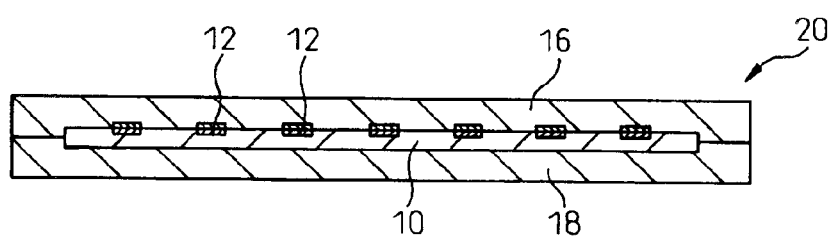

FIG. 1D shows the state after grinding the back side of the semiconductor wafer 10, then covering the front side and back side of the semiconductor wafer 10 by resin layers 16 and 18 to form a laminate 20. The resin layers 16 and 18 can be formed integrally with the semiconductor wafer 10 by using prepregs containing glass cloth used when producing ordinary resin boards to sandwich the semiconductor wafer 10 in the thickness direction and pressing and heating the same. The resin layers 16 and 18 act to protect the semiconductor wafer 10 by covering the front and back sides of the semiconductor wafer 10.

If it were possible to suitably select the thermal expansion coefficient of the resin material used for the resin layers 16 and 18 so as to make the thermal expansion coefficient of the semiconductor device as a whole substantially match with the thermal expansion coefficient of the mounting circuit board, it would be possible to reduce the heat stress occurring between the semiconductor device and mounting circuit board when mounting a semiconductor device on a mounting circuit board. The thicknesses of the resin layers 16 and 18 in the embodiment are about 60 to 200 μm, but the thicknesses of the resin layers 16 and 18 may be set to thicknesses able to suitably ease the heat stress occurring between the solder balls or other external connection terminals and the connecting parts provided on the mounting circuit board when mounting a semiconductor device on a mounting circuit board in relation to the thermal expansion coefficient of the resin material used for the resin layers 16 and 18. The resin layers 16 and 18 may use the same resin materials or may use different resin materials. The resin materials used for these resin materials 16 and 18 are selected in thermal expansion coefficients and thicknesses so that the laminate 20 does not warp when covering the two surfaces of the semiconductor wafer 10 and forming the laminate 20.

At the step shown in FIG. 1C, the back side of the semiconductor wafer 10 is ground to reduce the thickness of the semiconductor wafer 10 so as to reduce as much as possible the contribution of the thermal expansion coefficient of the semiconductor chip comprised of silicon to the semiconductor device as a whole when forming a semiconductor device. As explained above, the thermal expansion coefficient of silicon is considerably different from the thermal expansion coefficient of the resin board used for the mounting circuit board.

Therefore, if it were possible to suppress the contribution of the thermal expansion coefficient from the semiconductor chip and use a material close to the thermal expansion coefficient of the resin material forming the mounting circuit board as the resin material used for the resin layers 16 and 18, it would be possible to make the thermal expansion coefficient of the semiconductor device as a whole close to the thermal expansion coefficient of the mounting circuit board.

Note that as shown in FIG. 1D, when using the resin layers 16 and 18 to cover the two sides of the semiconductor wafer 10 and form a laminate 20, there is no need to form the laminate 20 to an overall shape of the same circular shape as the semiconductor wafer 10. It is sufficient to make it a rectangular shape or other shape facilitating the handling in later steps. The significance of making it a shape facilitating handling in later steps is that in the method of production of a semiconductor device of the present embodiment, production systems for the printed circuit board or other resin board are utilized to produce a wafer level package, so forming the laminate 20 to a shape facilitating handling in such production systems facilitates utilization of conventional systems.

Figure 1E:
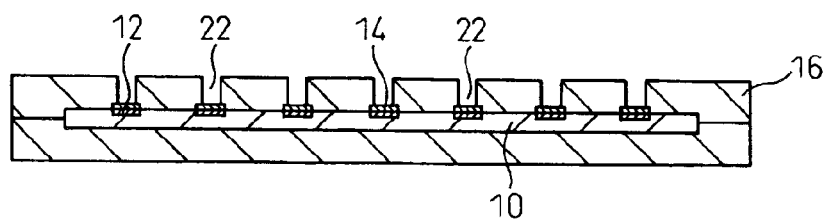

FIG. 1E shows the state of formation of via holes 22 in the resin layer 16 by laser processing. A laser beam is focused at the positions of arrangement of the electrode terminals 12 to form the via holes 22. The via holes 22 are provided so that the protective film 14 covering the electrode terminals 12 is exposed at the bottom surface. The surfaces of the electrode terminals 12 is covered by the protective film 14, so the electrode terminals 12 will not be damaged by the laser beam.

Figure 1F:
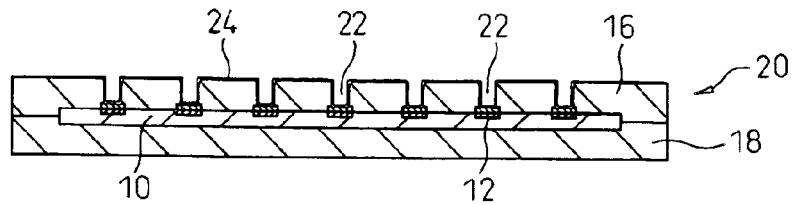
Figure 1G:
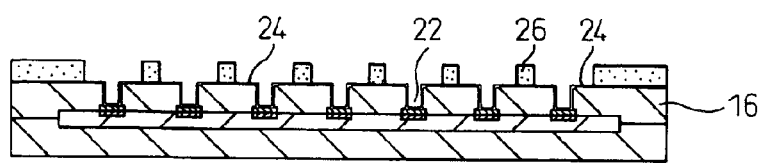

FIG. 1F shows the state of electroless copper plating of the laminate 20 for formation of a plating power feed layer 24 over the entire surface of the resin layer 16 including the inside surfaces of the via holes 22. The plating power feed layer 24 is for forming conductor parts serving as interconnect patterns by electroplating. FIG. 1G shows the state of exposure of parts for forming the interconnect patterns and covering the surface of the plating power feed layer by resist patterns 26. The resist patterns 26 can be formed by covering the surface of the resin layer 16 covered by the plating power feed layer 24 by a dry film or other photosensitive resin coating and exposing and developing the same.

Figure 1H:
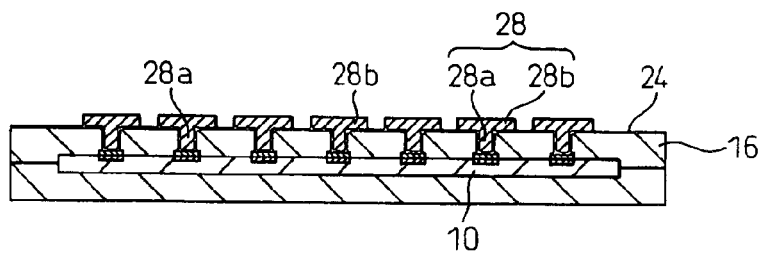
Figure 1I:
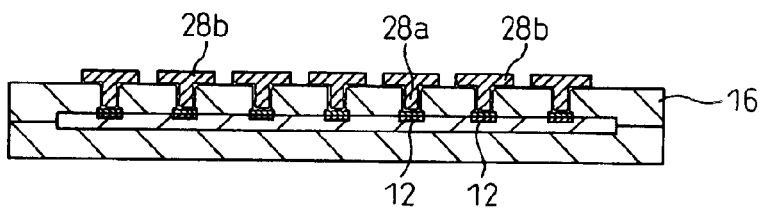

FIG. 1H shows the state of electrolytically copper plating the surface to build up copper plating 28 at exposed locations of the plating power feed layer 24, then removing the resist patterns 26. The copper plating 28 fills the via holes 22 and is formed to a predetermined thickness at exposed parts of the plating power feed layer 24 on the surface of the resin layer 16. In the present embodiment, the parts of the copper plating filled in the via holes 22 become the vias 28a, while the parts of the copper plating formed at the surface of the resin layer 16 become the lands 28b. FIG. 1I shows the state of removal of parts of the plating power feed layer 24 exposed on the surface of the resin layer 16 and formation of conductor parts to which the individual electrode terminals 12 and lands 28b are individually independently electrically connected via the vias 28a. The thickness of the plating power feed layer 24 is much smaller than the thickness of the copper plating 28 of the lands 28b etc., so the exposed parts of the lands 28b are not covered by the resist etc. and a ferric chloride or other copper etching solution is used to chemically etch the laminate 20 so as to remove the exposed parts of the plating power feed layer 24.

Figure 1J:
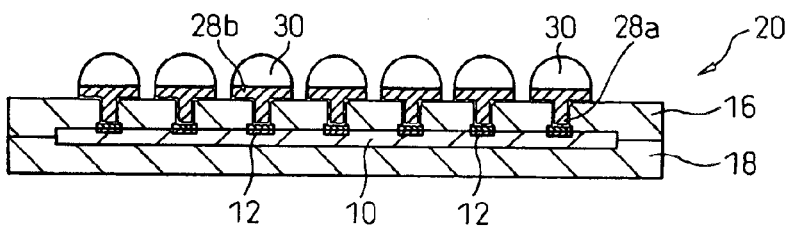
Figure 2:
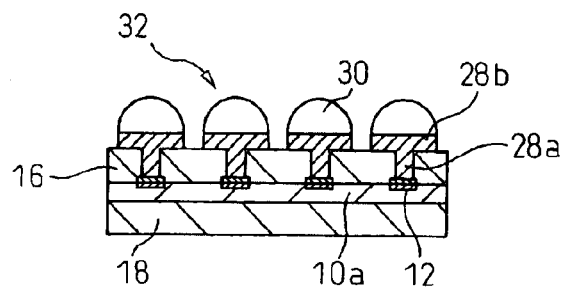
FIG. 2 is a cross-sectional view of the configuration of a semiconductor device obtained by dicing a laminate.

FIG. 1J shows the state of bonding of solder balls 30 as external connection terminals to all of the lands 28b exposed at the outer surface of the resin layer 16. Due to this, a laminate with solder balls 30 electrically connected with the electrode terminals 12 of the semiconductor wafer 10 provided at the outer surface of the resin layer 16 is obtained. FIG. 2 shows a semiconductor device (wafer level package) obtained by dicing the laminate 20 shown in FIG. 1J formed in a wafer shape into individual pieces. When dicing the laminate 20, it should be diced at the boundary positions of the individual semiconductor chips formed at the semiconductor wafer 10.

The semiconductor device 32 shown in FIG. 2 is comprised of a semiconductor chip 10a covered by resin layers 16 and 18 at the front and back sides, having solder balls 30 bonded to lands 28b formed on the surface of the resin layer 16, and having solder balls 30 and electrode terminals 12 of the semiconductor chip 10a electrically connected through the vias 28a. When mounting the semiconductor device 32, it is sufficient to bond the solder balls 30 positioned at the connecting parts provided at the mounting circuit board.

The two surfaces of the semiconductor chip 10a are covered by the resin layers 16 and 18, so the semiconductor chip 10a is reliably protected. The back side of the semiconductor chip 10a is not exposed to the outside, so interconnects etc. will not contact the outer surface of the semiconductor chip 10a and cause an electrical short-circuit. When mounting the semiconductor device to a mounting circuit board, the resin layers 16 and 18 act to ease heat stress caused between the solder balls 30 and the connection terminals. Therefore, it is possible to eliminate the problem of the concentration of heat stress and the occurrence of cracks at the bonding parts of the solder balls 30 and connection terminals.

Note that with the method of production of a semiconductor device shown in FIGS. 1A to 1J and FIG. 2, starting from the step of forming the protective film 14 on the electrode terminals 12 formed on the semiconductor wafer 10, the method of production used in a conventional resin board production process is utilized. In particular, the step of forming the conductor parts for electrical connection with the electrode terminals 12 shown in FIG. 2 utilizes the semiadditive method frequently used in the past as the method for production of resin boards. In this way, the present embodiment is characterized by using the production method and apparatus used conventionally for a production method of a resin board for formation of a semiconductor device (wafer level package).

In the embodiment shown in FIGS. 1A to 1J and FIG. 2, lands 28b were simply formed in the same arrangement as the electrode terminals 12 of the semiconductor wafer 10, but it is also possible to produce a semiconductor device by laying interconnect patterns on the surface of the semiconductor wafer 10. FIGS. 3A to 3E show the steps of covering the front and back sides of the semiconductor wafer 10 by the resin layers 16 and 18 (FIG. 3A), forming via holes 22 at the resin layer 16 (FIG. 3B), forming a plating power feed layer 24 over the entire surface of the resin layer 16 including the via holes 22 by electroless copper plating (FIG. 3C), forming resist patterns 26a on the surface of the resin layer 16 (FIG. 3D), and electroplating copper to form a conductor layer forming the interconnect patterns (redistribution patterns) 28c and bonding solder balls 30 to the land parts of the interconnect patterns 28c so as to form a laminate (FIG. 3E).

Figure 3A:
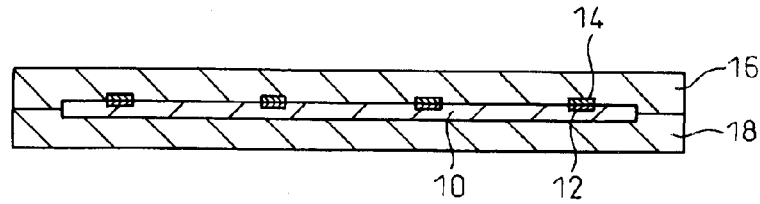
FIGS. 3A to 3E are cross-sectional views of another method of production of a semiconductor device according to the present invention.
Figure 3B:
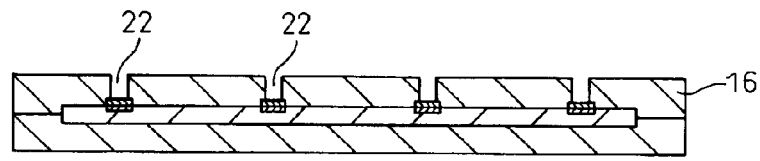
Figure 3C:
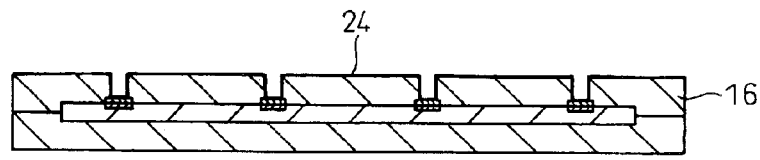
Figure 3D:
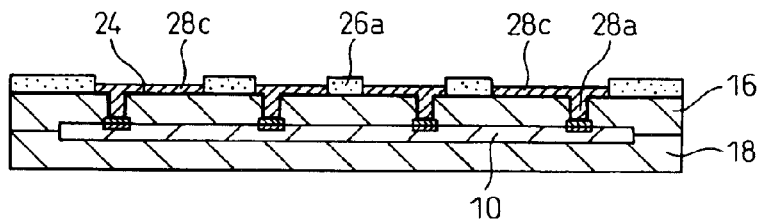
Figure 3E:
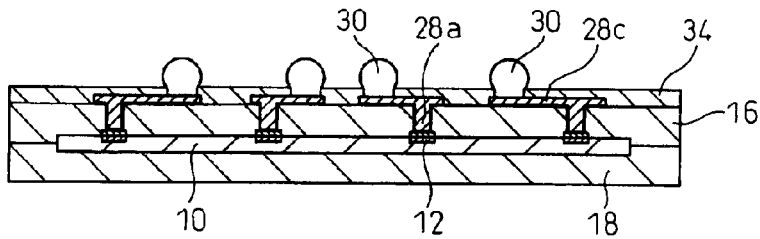

As shown in FIG. 3D, the interconnect patterns 28c forming reinterconnects are formed on the surface of the resin layer 16 in a state electrically connected with the electrode terminals 12 through the vias 28a. It is possible to obtain the laminate shown in FIG. 3E by removing the resist patterns 26a, etching away the plating power feed layer 24 exposed at the surface of the resin layer 16 and covering the surface of the resin layer 16 by the insulating resin 34 so as to leave exposed only lands of the interconnect patterns 28c, then bonding solder balls 30 to the lands. A semiconductor device is obtained by dicing the laminate shown in FIG. 3E into individual pieces. The semiconductor device is obtained in the form with the electrode terminals 12 and interconnect patterns 28a electrically connected through the vias 28a and with solder balls 30 bonded to the lands provided at the interconnect patterns 28a.

Figure 4A:
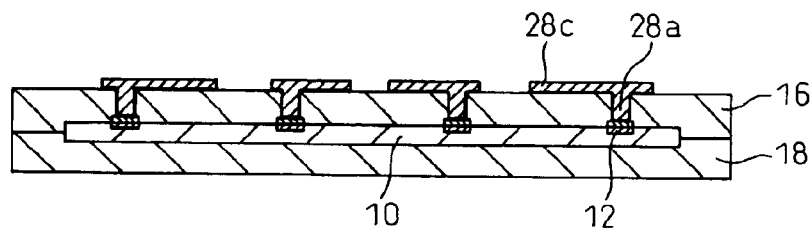
FIGS. 4A to 4D are cross-sectional views of still another method of production of a semiconductor device according to the present invention.
Figure 4B:
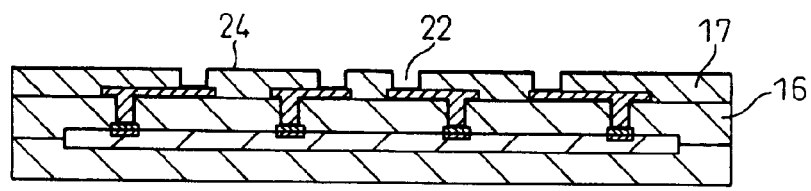
Figure 4C:
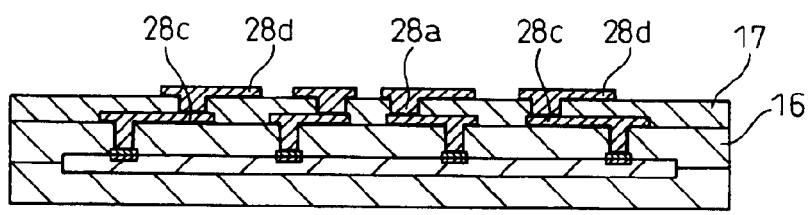

In the method of production of a semiconductor device shown in FIGS. 3A to 3E, only one layer of interconnect patterns 28c is formed on the surface of the resin layer 16. FIGS. 4A to 4D show an example of stacking a plurality of layers of interconnect patterns through electrical insulating layers. FIG. 4A shows the state of formation of a first layer of interconnect patterns 28c on the surface of the resin layer 16 electrically connected with the electrode terminals 12c. FIG. 4B shows the state of formation of a resin layer 17 above the interconnect patterns 28c and formation of via holes 22 by laser processing the resin layer 17. FIG. 4C shows the state of formation of a second layer of interconnect patterns 28d on the surface of the resin layer 17 utilizing the plating power feed layer 24 to electrically connect with the underlying interconnect patterns 28c.

Figure 4D:
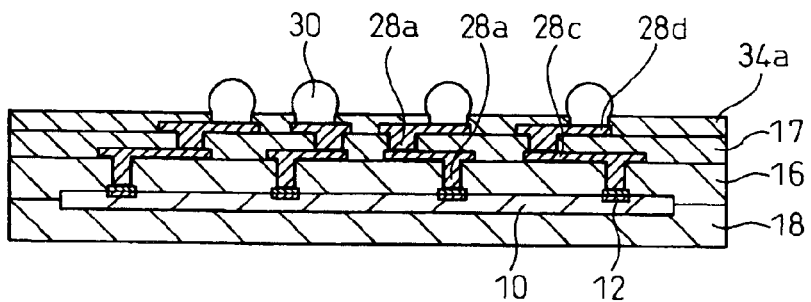

FIG. 4D shows the state of covering the surface of the resin layer 17 by an insulating resin 34a so as to leave exposed only lands of the interconnect patterns 28, then bonding solder balls 30 to the lands. In this way, it is possible to electrically insulate layers from each other by the resin layers 16 and 17 on the electrode terminal forming surface of the semiconductor wafer 10 and obtain a laminate with electrode terminals 12 and solder balls electrically connected through the two layers of interconnect patterns 28c and 28d. By dicing the laminate into individual pieces, it is possible to obtain a semiconductor device (wafer level package).

According to the method of production of a semiconductor device shown in FIGS. 4A to 4D, by dicing the laminate into individual pieces, it is possible to obtain a semiconductor device comprised of a semiconductor chip 10a on the electrode terminal forming surface of which a plurality of interconnect layers are formed. In this way, when forming interconnect patterns on the electrode terminal forming surface of the semiconductor wafer 10, it is possible to form interconnect patterns in any pattern and possible to form a plurality of interconnect layers stacked together. The method of forming these interconnect patterns utilizes the conventional method of production of a resin board as it is and is not particularly complicated in steps. Further, the method of production of a semiconductor device of the present method, as explained above, does not depend on sputtering or other thin film processes, so it is possible to utilize conventional production systems utilized for production of resin boards. Particularly, there is no need to use an expensive production system.

Summarizing the effects of the invention, according to the method of production of a semiconductor device according to the present invention, as explained above, starting from the step of forming a protective film on the electrode terminals of the semiconductor wafer, it is possible to utilizing a conventional method of production of a resin board to produce a semiconductor device without using an expensive production system for semiconductor devices and thereby possible to keep down the cost of production of a semiconductor device. In particular, even when processing a semiconductor wafer larger than in the past, it is possible to utilize a conventional production system for resin boards. Therefore, there is no need to construct a new production system and the investment cost can be suppressed.

Further, the semiconductor device obtained by the method of the present invention is covered at the two surfaces of the semiconductor chip by a resin layer so there are the advantages that the semiconductor chip is reliably produced and the heat stress acting on the external connection terminals when mounting the semiconductor device by a resin layer can be eased.

While the invention has been described with reference to specific embodiments chosen for purpose of illustration, it should be apparent that numerous modifications could be made thereto by those skilled in the art without departing from the basic concept and scope of the invention.

What is claimed is:

1. A method of production of a semiconductor device comprising forming vias and other conductor parts on an electrode terminal forming surface of a semiconductor wafer, that are electrically connected with electrode terminals, and dicing the semiconductor wafer into individual semiconductor chips to form chip size semiconductor devices, comprising the steps of:

electrolessly plating said electrode terminals to cover the surfaces of the electrode terminals by a protective film protecting the electrode terminals from laser beams, grinding the back side of the semiconductor wafer to reduce the thickness of the semiconductor wafer before or after forming the protective film, covering the entirety of the electrode terminal forming surface and back side of the semiconductor wafer, having the electrode terminals covered by a protective film and processed to reduce the thickness of the semiconductor wafer, by a resin to form a laminate, and focusing a laser beam toward the electrode terminal forming surface of the semiconductor wafer from outside the laminate to form via holes with said protective film exposed at their bottom surfaces, then filling said via holes by electroplating to form said conductor parts.

2. A method of production of a semiconductor device as set forth in claim 1, further comprising the steps of:

bonding external connection terminals at lands of the conductor parts after forming the conductor parts and dicing the semiconductor wafer into individual semiconductor chips after bonding the external connection terminals to the lands.

3. A method of production of a semiconductor device as set forth in claim 1, further comprising, when covering the entirety of the electrode terminal forming surface and back side of the semiconductor wafer by a resin, using a resin having a thermal expansion coefficient close to the thermal expansion coefficient of a resin board.

4. A method of production of a semiconductor device as set forth in claim 1, further comprising forming interconnect patterns electrically connected with the conductor parts through the electrical insulating layer after forming the conductor parts.

* * * * *

UNITED STATES PATENT AND TRADEMARK OFFICE
CERTIFICATE OF CORRECTION

| | |
|---|---|
| PATENT NO. | : 6,951,811 B2 |
| APPLICATION NO. | : 10/828328 |
| DATED | : October 4, 2005 |
| INVENTOR(S) | : Haruo Sorimachi |

Page 1 of 1

It is certified that error appears in the above-identified patent and that said Letters Patent is hereby corrected as shown below:

In the specification, Column 4, line 52, after "board.", delete the paragraph return.

Signed and Sealed this

Twenty-second Day of August, 2006

JON W. DUDAS
*Director of the United States Patent and Trademark Office*